(12) United States Patent
Uratani et al.

(10) Patent No.: US 7,736,118 B2
(45) Date of Patent: Jun. 15, 2010

(54) TRANSFER APPARATUS

(75) Inventors: Takafumi Uratani, Osaka (JP); Daisuke Sado, Osaka (JP); Hideki Matsuo, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 12/148,013

(22) Filed: Apr. 16, 2008

(65) Prior Publication Data

US 2008/0260503 A1 Oct. 23, 2008

(30) Foreign Application Priority Data

Apr. 19, 2007 (JP) ............... 2007-110579

(51) Int. Cl.
*B25J 17/00* (2006.01)
(52) U.S. Cl. .................. 414/744.6; 414/744.2; 901/14; 901/17; 901/28; 74/490.01; 74/490.05; 403/359.1
(58) Field of Classification Search ............. 414/744.1, 414/744.2, 744.3, 744.5, 744.6; 901/15, 901/14, 17; 74/490.01, 490.05; 403/359.1
See application file for complete search history.

(56) References Cited

U.S. PATENT DOCUMENTS 7,306,423 B2 12/2007 Ogawa et al.

2005/0036877 A1* 2/2005 Ogawa et al. ............ 414/744.2
2005/0254890 A1* 11/2005 Schulz et al. ............ 403/359.1

FOREIGN PATENT DOCUMENTS

JP 2005-125479 5/2005

* cited by examiner

*Primary Examiner*—Donald Underwood
(74) *Attorney, Agent, or Firm*—Hamre, Schumann, Mueller & Larson, P.C.

(57) ABSTRACT

A transfer apparatus includes a stationary base, a swivel supported by the stationary base to be rotatable about a vertical axis, a guide member mounted on the swivel, a linear movement mechanism supported by the swivel or the guide member, a hand supported by the linear movement mechanism and moved by the linear movement mechanism for carrying a work along a straight and horizontal travel stroke, a drive source disposed inside the stationary base, and a transmission shaft disposed along the vertical axis to transmit drive power from the drive source to the linear movement mechanism. The swivel includes an upper section and a lower section detachably connected with each other. The upper section has a connecting member supported by the upper section to be rotatable about the vertical axis. The connecting member has a detachable engagement member for engagement with the transmission shaft from the above.

4 Claims, 11 Drawing Sheets

TRANSFER APPARATUS

BACKGROUND OF THE INVENTION

1. Field of the Invention

The present invention relates to a transfer apparatus, in particular to a transfer apparatus designed to carry a thin plate-like work such as a substrate along a straight path.

2. Description of the Related Art

Among conventional transfer apparatuses, there is a type which has a mechanism for moving their hands along a straight path (linear movement mechanism). These robots are simpler in construction and less expensive than so called multi-joint robots, and used widely in e.g. manufacturing processes of semiconductor devices and liquid crystal display panels, for moving thin plate-like works such as wafers and glass substrates into and out of different process chambers.

Such a transfer apparatus for carrying a thin plate-like work is disclosed in JP-A-2005-125479, for example. The conventional transfer apparatus includes link arm mechanisms supported by a swivel. The link arm mechanisms have their end portions provided with a hand which is capable of holding a plate-like work such as a substrate horizontally. The swivel is supported rotatably with respect to a stationary base. As the swivel turns about a vertical swivel axis on the stationary base, the link arm mechanisms are rotated therewith. The stationary base incorporates therein a drive source for driving the link arm mechanisms, and a transmission shaft extending into the swivel to transmit power from the drive source to the link arm mechanisms. As the driving power is transmitted from the drive source in the stationary base via the transmission shaft, the link arm mechanisms are actuated and as the link arm mechanisms are actuated, the plate-like work held by the hands are moved linearly in a horizontal plane, whereby the plate-like works are moved from a predetermined location to another location. The swivel also supports guide members. To the guide members, guide rails are fixed so as to support and guide the hands when they are moved in a predetermined direction as the link arm mechanisms swing open and close. This arrangement enables to move the hands with the plate-like works more stably along the linear path.

Meanwhile, a recent trend in the manufacture of liquid crystal display panels, for example, is to increase the panel size. This leads to a requirement for increase in the size of the hands in the transfer apparatus, increase in the size of the work to be transported thereby, and as a result, increase in the distance of the transport path.

However, as the travel stroke increases with the increasing size of the work, the overall size of a transfer apparatus also have to increase. Because of such size increase, the handling of a transfer apparatus at the time of installing, for example, tends to be difficult.

SUMMARY OF THE INVENTION

The present invention has been proposed under the above-described circumstances, and it is therefore an object of the present invention to provide a transfer apparatus which can be handled easily at the time of installation for example.

The present invention provides a transfer apparatus which includes: a stationary base; a swivel which is rotatable relative to the stationary base about a vertical axis; a guide member which is mounted on the swivel; a linear movement mechanism which is supported by the swivel or the guide member; a hand which is supported by the linear movement mechanism and moved by the linear movement mechanism to carry a work along a straight and horizontal travel stroke; a drive source which is disposed inside the stationary base; and a transmission shaft which is disposed along the vertical axis to transmit drive power from the drive source to the linear movement mechanism. The swivel includes an upper section and a lower section which are connected with each other, vertically detachably from each other. The upper section has a connecting member which is rotatable relative to the upper section about the vertical axis, and the connecting member has a detachable engagement member which engages with the transmission shaft from the above.

According to the transfer apparatus offered by the present invention, the swivel, which supports the linear movement mechanism and rotates about the vertical axis, is separable into an upper section and a lower section. The upper section supports a connecting member, which transmits drive power to the linear movement mechanism, rotatably about the vertical axis. Further, the connecting member is provided with an engagement member which is engaged with the transmission shaft from above. According to such an arrangement as the above, the engagement member can be removed from the connecting member at a time of installation for example, and then pulled up to disconnect the transmission shaft from the connecting member. Then, by disconnecting the upper section of the swivel from the lower section thereof, the swivel can be separated in the vertical direction. In other words, it becomes possible to separate the relatively long linear movement mechanism as an assembly as supported by the guide member or the upper section of the swivel. This makes it easy to handle the transfer apparatus at the time of installation for example.

According to a preferred embodiment, the hand includes a first and a second hands which are movable along the travel stroke without interfering with each other. The linear movement mechanism includes a first and a second drive mechanisms which drive the first and the second hands respectively. The connecting member is constituted by a first and a second connecting members which are disposed concentrically to each other in correspondence to the first and the second drive mechanisms. The transmission shaft is constituted by a first and a second transmission shafts which are disposed concentrically to each other in correspondence to the first and the second drive mechanism. The engagement member includes a first engagement member which is engageable with the first transmission shaft and is detachable from the first connecting member, and a second engagement member which is engageable with the second transmission shaft and is detachable from the second connecting member.

The transfer apparatus according the arrangement described above is applicable suitably to so-called two-arm transfer apparatus which has two hands which can be driven independently from each other.

According to a preferred embodiment, the first and the second transmission shafts are spaced from the first and the second connecting members by a predetermined gap circumferentially of the vertical axis.

According to such an arrangement as the above, once the first and the second engagement members are removed from the first and the second connecting members respectively, there is provided a predetermined space circumferentially of the vertical axis, separating the first and the second transmission shafts from the first and the second connecting members. With this arrangement, when separating or connecting the upper section of the swivel from or with the lower section of the swivel, it is possible to avoid undue contact between the transmission shaft and the connecting member even if the upper section is moved up or down, eliminating a problem of gauging or deforming of these members as a result of their mutual contact.

According to a preferred embodiment, each of the first and the second transmission shafts has an upper end formed as a spline shaft portion, and each of the first and the second engagement members has a spline boss portion which makes engagement with a corresponding one of the spline shaft portions.

According to such an arrangement as the above, the first and the second transmission shafts are connected with the first and the second engagement members respectively by spline, which ensures proper engagement status between these members. Therefore, rotation drive power of the first and the second transmission shafts is transmitted to the first and the second connecting members via the first and the second engagement members.

According to a preferred embodiment, each of the first and the second connecting members has a partial overlap with the upper section within its rotation plane. The upper section and the first and the second connecting members have a through-hole for insertion of a pin.

Such an arrangement as the above allows insertion of a pin through all of the through-holes in the upper section as well as the first and the second connecting members when separating the upper section of the swivel from the lower section thereof. This prevents the first and the second connecting members from rotating with respect to the upper section, eliminating need for adjustment such as re-positioning, at the time when connecting the upper and the lower sections, making the transfer apparatus easy to handle.

DETAILED DESCRIPTION OF THE PREFERRED EMBODIMENTS

Preferred embodiments of the present invention will be described below with reference to the drawings.

Figure 1:
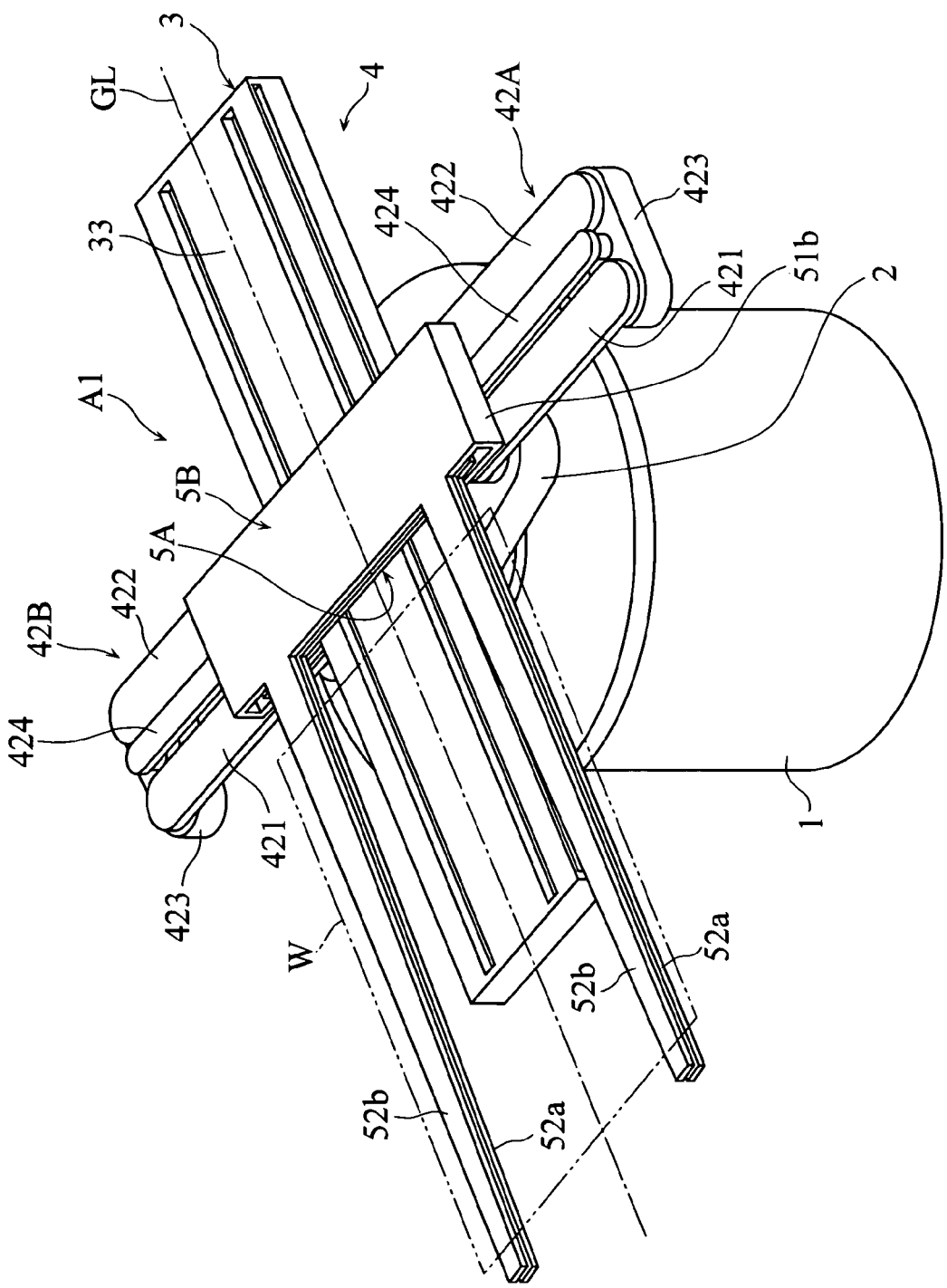
FIG. 1 is an overall perspective view of a transfer apparatus according to a first embodiment of the present invention.
Figure 2:
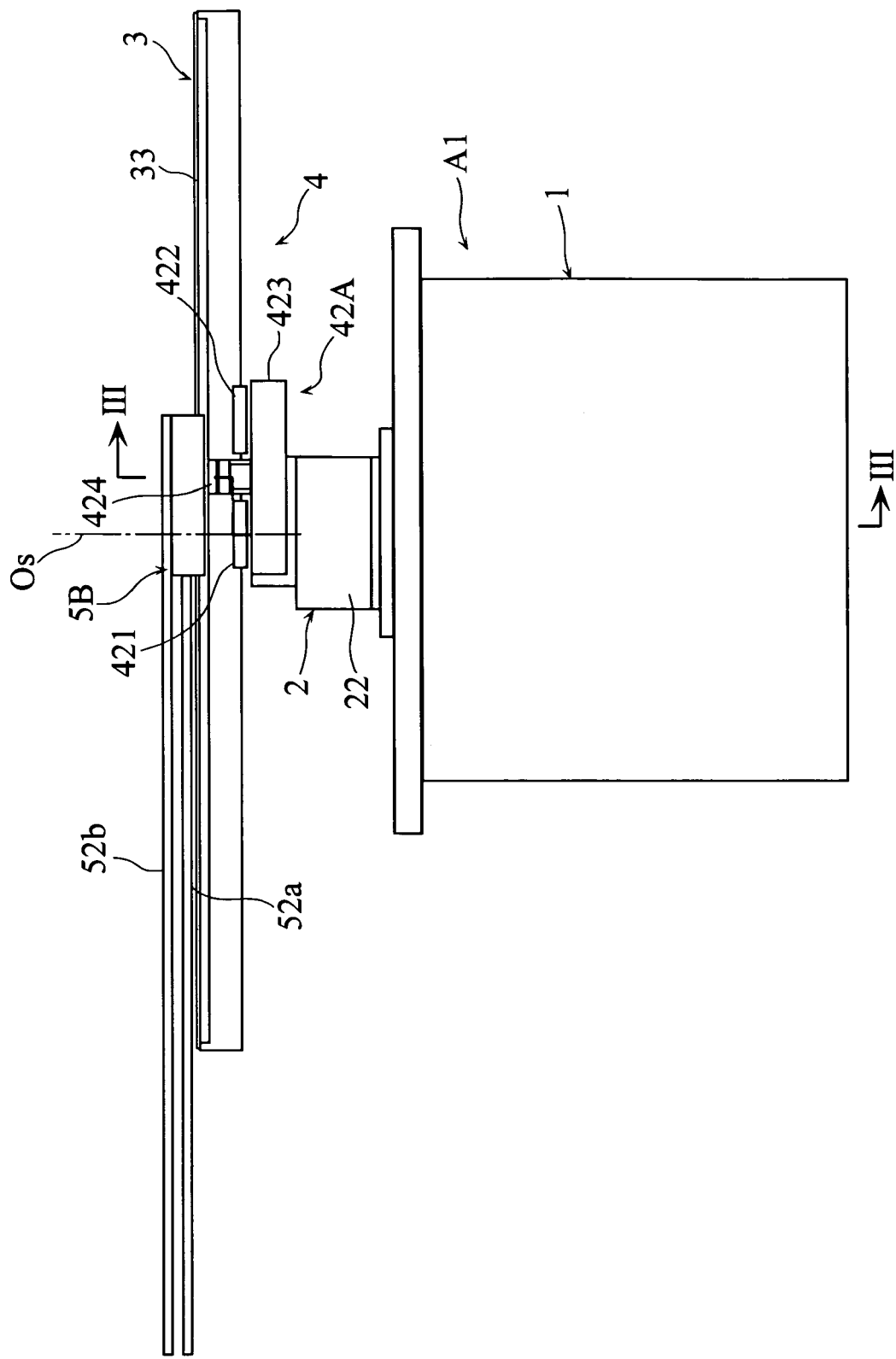
FIG. 2 is a side view of the transfer apparatus in FIG. 1.
Figure 3:
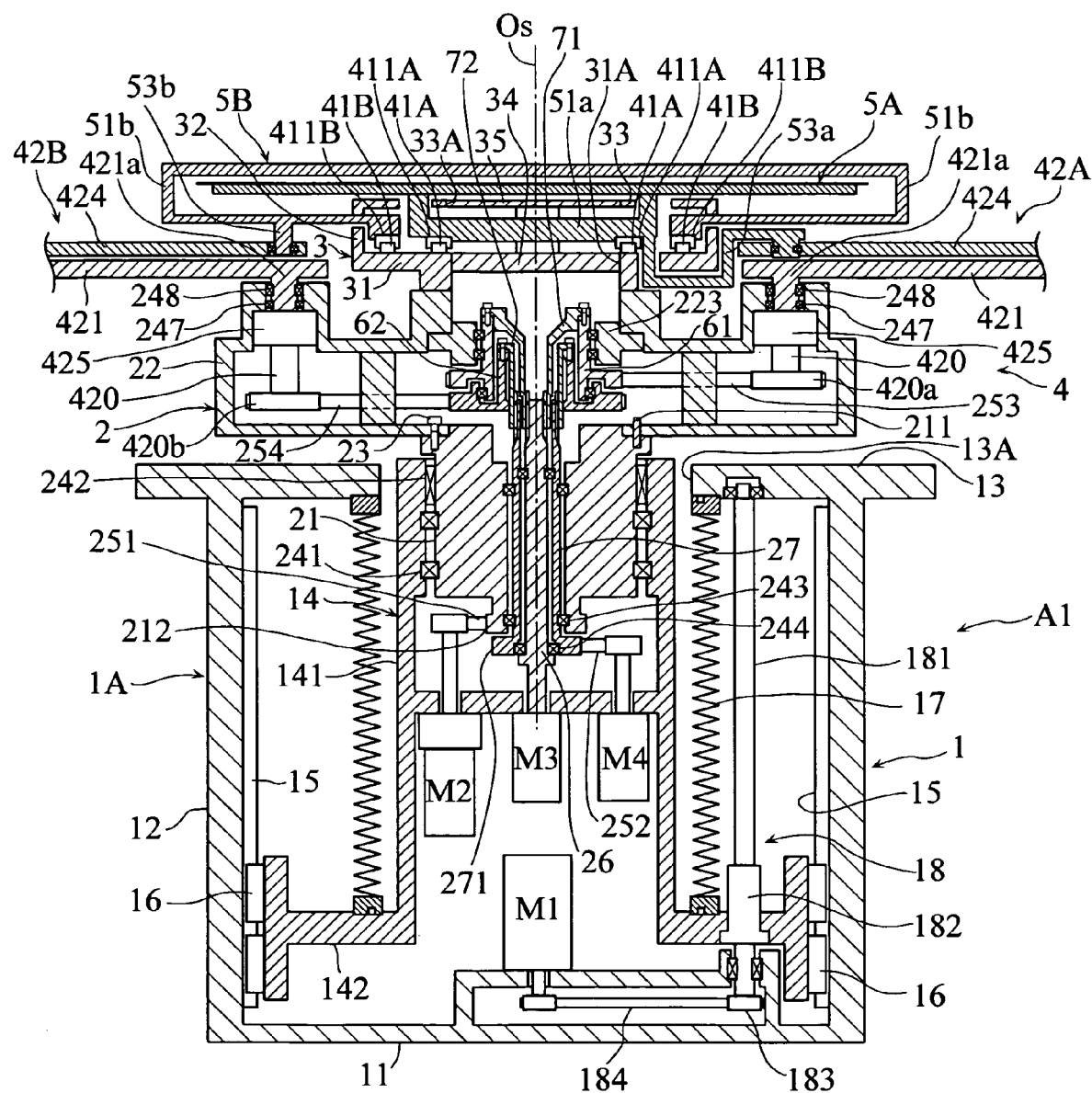
FIG. 3 is a sectional view taken along lines III-III in FIG. 2.

FIG. 1 through FIG. 5 show a transfer apparatus according to a first embodiment of the present invention. The transfer apparatus A1 is for transporting a thin plate-like work W such as a substrate for liquid crystal display panels. As shown in FIG. 1 through FIG. 3, the transfer apparatus A1 includes a stationary base 1, a swivel 2 which is supported rotatably about a vertical axis Os by the stationary base 1, a guide member 3 which is mounted on the swivel 2, a linear movement mechanism 4 which is supported by the swivel 2 or the guide member 3, and a pair of hands 5A, 5B which are supported by the linear movement mechanism 4 independently from each other. Each of the hands 5A, 5B is used to hold the thin plate-like work W horizontally.

As shown clearly in FIG. 3, the stationary base 1 includes a housing 1A which has a substantially columnar shape defined by a bottom wall portion 11, a cylindrical side wall portion 12, and a ceiling wall portion 13. The ceiling wall portion 13 has a center hole 13A.

The stationary base 1 supports a lift base 14 therein. The lift base 14 includes: a cylindrical portion 14 which has a smaller outer diameter than the center hole 13A and a predetermined dimension in the vertical direction; and an outward flange 142 which is formed at a lower end of the cylindrical portion 141. The side wall portion 12 of the housing 1A has an inner wall provided with a plurality of vertical linear guide rails 15. The linear guide rails 15 slidably support a plurality of guide members 16 which are provided on the outward flange 142 of the lift base 14 for vertical sliding movement with respect to the linear guide rails 15. Thus, the first lift base 14 is vertically movable with respect to the stationary base 1 within a predetermined range, with an upper portion of the cylindrical portion 141 of the lift base 14 moving in and out of the center hole 13A of the housing 1A.

The cylindrical portion 141 is surrounded by a bellows 17, which has two ends fixed to the ceiling wall portion 13 of the stationary base 1 and to the outward flange 142 of the lift base 14. The bellows 17 provides air-tight sealing between the ceiling wall portion 13 of the stationary base 1 and the outward flange 142 of the lift base 14 regardless of the vertical movement of the lift base 14.

Outside of the bellows 17, the stationary base 1 also incorporates a ball screw mechanism 18 which includes a vertical rotating threaded shaft 181 and a nut 182 threaded onto the threaded shaft 181. The threaded shaft 181 has a lower end provided with a pulley 183 which penetrates and is fixed to the outward flange 142, and a belt 184 is routed around the pulley to connect the shaft with a motor M1. The motor M1 rotates the threaded shaft 181 in a normal or a reverse direction. The rotation of the threaded shaft 181 thus achieved raises or lowers the lift base 14.

The swivel 2 includes a cylindrical shaft 21 (lower section), and a housing 22 (upper section) provided above the shaft 21. The cylindrical shaft 21 and the housing 22 are fastened to each other by a plurality of fastening bolts 23 (only one is shown in FIG. 3), and are separable from each other in the vertical direction. When the housing 22 and the cylindrical shaft 21 are in a connected state, air-tight sealing is provided between the cylindrical shaft 21 and the housing 22 by an unillustrated seal member. The cylindrical shaft 21 is supported rotatably about the vertical axis Os via a bearing 241, inside the cylindrical portion 141 of the lift base 14. Between the cylindrical portion 141 and the cylindrical shaft 21 is another sealing mechanism 242 which is disposed above the bearing 241. The sealing mechanism 242 keeps air-tight sealing between the space above the sealing mechanism 242 and the inside space of the lift base 14 below the sealing mechanism 242. The cylindrical shaft 21 has an upper portion provided with a plurality of knock pins 211 (only one is shown in FIG. 3) for positioning purpose. The knock pins 211 are inserted into pin holes 221 made in the housing 22. The cylindrical shaft 21 has a lower end provided with a pulley 212 which is formed integrally therewith, and a belt 251 is routed around the pulley 212 and a pulley which is attached to an output shaft of a motor M2 supported inside of the cylindrical portion 141. Thus, as the motor M2 drives, the swivel 2 rotates about the vertical axis Os.

Through the cylindrical shaft 21 of the swivel 2, a first and a second transmission shafts 26, 27 are inserted concentrically about the vertical axis Os for transmitting power to a first and a second link arm mechanisms 42A, 42B which are to be described later. The second transmission shaft 27 is a cylindrical shaft, and is supported rotatably inside the cylindrical shaft 21 via a bearing 243. The first transmission shaft 26 is supported rotatably inside the second transmission shaft 27 via a bearing 244. The first transmission shaft 26 has a lower end which is connected with an output shaft of a motor M3 supported inside the cylindrical portion 141. On the other hand, the second transmission shaft 27 has a lower end provided with a pulley 271, and a belt 252 is routed around the pulley 271 and a pulley attached to an output shaft of a motor M4 installed in the cylindrical portion 141. As shown clearly in FIG. 4, the first and the second transmission shaft 26, 27 have their upper ends formed with spline shaft portions 262, 272 respectively.

Figure 4:
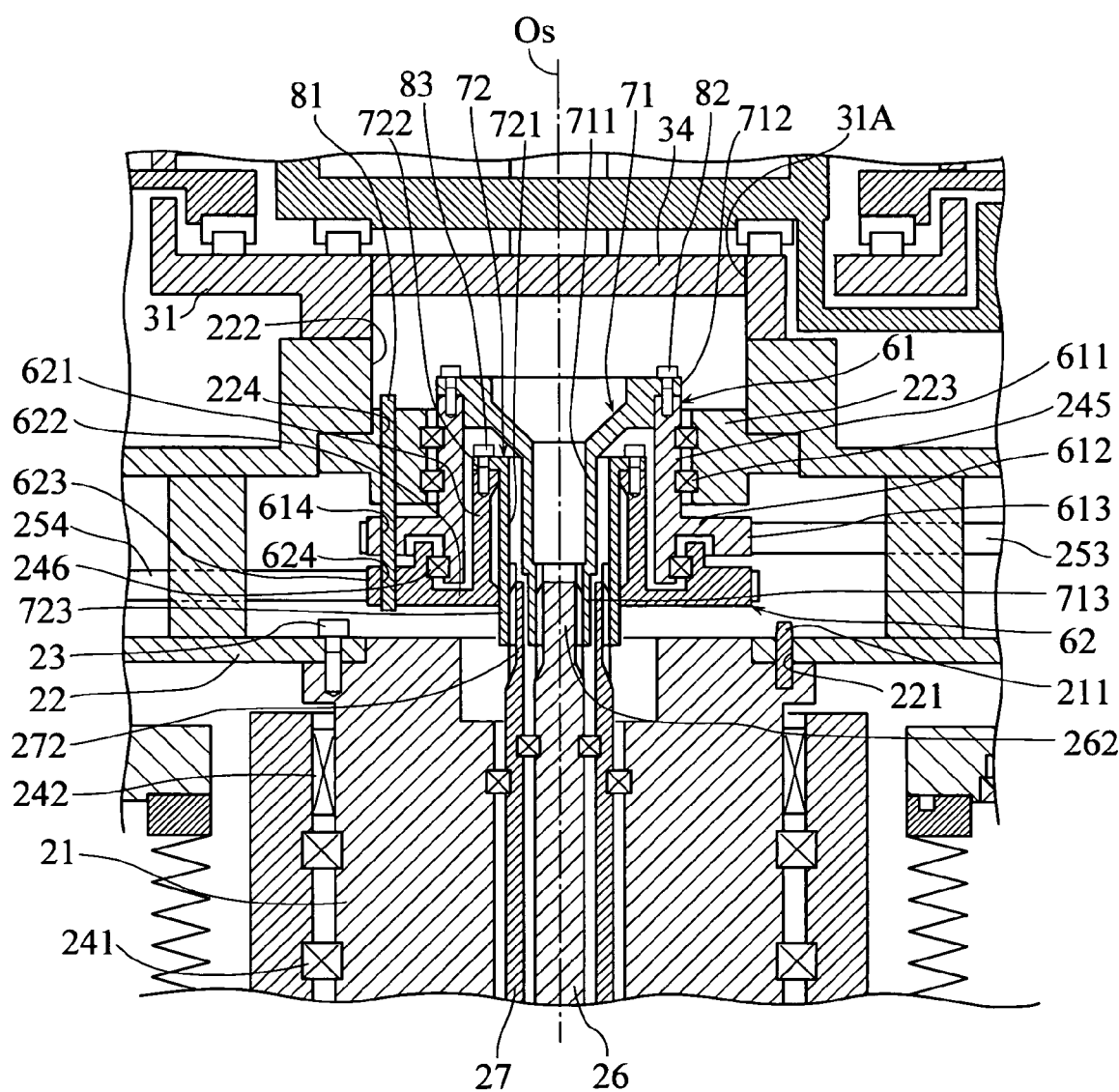
FIG. 4 is an enlarged partial view of FIG. 3.

The housing 22 of the swivel 2 has an upper center area having an opening 222, and below the opening 222, an annular support member 223 is fixed. The support member 223 accommodates a first and a second connecting members 61, 62 coaxially about the vertical axis Os. As shown in FIG. 4, a through-hole 224 is made at a predetermined place in the support member 223 in parallel to the vertical axis Os.

As shown in FIG. 4, the first connecting member 61 has a cylindrical shaft 611 and a flange portion 612 which extends in a circumferentially outward direction with respect to the cylindrical shaft 611. The first connecting member 61 is supported rotatably inside the support member 223 via a bearing 245. The flange portion 612 is below the support member 223 in an overlapped manner within a rotation plane of the second connecting member 61. The flange portion 612 has a circumferential edge provided with a pulley 613. A through-hole 614 is provided at a predetermined place in the flange portion 612 in parallel to the vertical axis Os.

The second connecting member 62 has a cylindrical shaft 621 and a flange portion 622 extending in a circumferentially outward direction with respect to the cylindrical shaft 621. The second connecting member 62 is supported rotatably by the cylindrical shaft 611 of the first connecting member 61 via a bearing 246. The cylindrical shaft 621 is inward of the cylindrical shaft 611 of the first connecting member 61. The flange portion 622 is provided below the support member 223 and the flange portion 612 in an overlapped manner within a rotation plane of the second connecting member 62. The flange portion 622 has a circumferential edge provided with a pulley 623. A through-hole 624 is made at a predetermined place in the flange portion 622 in parallel to the vertical axis Os.

The through-hole 224 of the support member 223 and the through-holes 614, 624 of the first and the second connecting members 61, 62 are concentric about the vertical axis Os. Thus, it is possible to align these through-holes 224, 614, 624 on a line along the vertical axis Os, and by inserting a pin 81 under this state through these through-holes 224, 614, 624 as shown in FIG. 4, the first and the second connecting members 61, 62 are prevented from rotating relatively to the support member 223.

The cylindrical shaft 611 of the first connecting member 61 has an upper end provided detachably with a first engagement member 71 via mounting bolts 82. More specifically, the first engagement member 71 has a cylindrical shaft 711 and an outward flange 712 which is provided on an upper end of the cylindrical shaft 711 and is placed on the cylindrical shaft 611 of the first connecting member 61. The cylindrical shaft 711 has a lower end formed with a spline boss portion 713 which is engaged by the spline shaft portion 262 formed on the upper end of the first transmission shaft 26. Thus, it is possible to set the first engagement member 71 into engagement with the first transmission shaft 26 from above.

The cylindrical shaft 621 of the second connecting member 62 has an upper end provided detachably with a second engagement member 72 via a mounting bolt 83. More specifically, the second engagement member 72 has a cylindrical shaft 721 and an outward flange 722 which is provided on an upper end of the cylindrical shaft 721 and is placed on the cylindrical shaft 621 of the second connecting member 62. The cylindrical shaft 721 has a lower end formed with a spline boss portion 723 which is engaged by the spline shaft portion 272 formed on the upper end of the second transmission shaft 27. Thus, it is possible to set the second engagement member 72 into engagement with the second transmission shaft 27 from above. Note here that the cylindrical shaft 721 is on the outside of the cylindrical shaft 711 of the first engagement member 71 and inside of the cylindrical shaft 621 of the second connecting member 62. Because of this construction, removing the second engagement member 72 from the second connecting member 62 will leave a gap between the spline shaft portion 272 of the second transmission shaft 27 and the cylindrical shaft 621 of the second connecting member 62, and the gap is substantially equal to the thickness of the cylindrical shaft 721.

The linear movement mechanism 4 moves the hands 5A, 5B along a linear, horizontal travel stroke GL, and as shown in FIG. 3, includes guide rails 41A, 41B provided on the guide member 3, and link arm mechanisms 42A, 42B which transmit horizontal driving power to the hands 5A, 5B.

The guide member 3, which supports the guide rails 41A, 41B, has a long rectangular shape as in a plan view, with a horizontal, longitudinal axis (travel stroke GL), and includes a bottom wall 31, right and left upright walls 32 formed on respective side edges of the bottom wall 31, and a cover 33. The guide rails 41A, 41B are supported by the bottom wall 31. The guide rails 41A, 41B are covered by the cover 33. The bottom wall 31 has a center area which has an opening 31A, and to this opening 31A, a lid 34 is attached detachably, providing air-tight sealing to the opening 31A. The cover 33 has a center area with an opening 33A, and to this opening 33A a lid 35 is attached detachably, providing air-tight sealing to the opening 33A. The bottom wall 31 is fixed to the housing 22 of the swivel 2, and as the swivel 2 rotates, the guide member 3 rotates, together.

The hand 5A is supported by the pair of inner guide rails 41A via a support arm 51a supporting from below and sliders 411A provided on the bottom of the support arm 51a. The hand 5B is supported by the pair of outer guide rails 41B via a pair of support arms 51b formed to detour the sides of the hand 5A and sliders 411B provided on the bottom of the support arms 51b.

The hands 5A, 5B are provided respectively with fork-like fingers 52a, 52b formed integrally therewith and extending longitudinally of the guide member 3. The thin plate-like works W are placed on these fingers 52a, 52b. Further, the hand 5A includes an extension 53a provided on the support arm 51a. The extension 53a penetrates a slit formed in the bottom wall 31 of the guide member 3, and extends outward below the outside guide rails 41B. The extension 53a is rotatably connected with an end of an arm 424 (the arm on the right-hand side as in FIG. 3) of the link mechanism 42A. On the other hand, the hand 5B includes a shaft 53b which is provided on the support arm 51b. The shaft 53b is rotatably connected with an end of an arm 424 (the arm on the left-hand side as in FIG. 3) of the link mechanism 42B.

Each of the link arm mechanisms 42A, 42B is structured by linking a plurality of arms 421 through 424, but detailed description will not be given here since the link arm mechanisms 42A, 42B are made and operated in a conventional way. The arm 421 has a base end 421a which is supported rotatably in an opening of the housing 22 of the swivel 2 via a bearing 247. The base end 421a has a lower end connected with a rotation shaft 420 via a speed reduction mechanism 425. Between the base end 421a and an upper portion of the housing 22 is a sealing mechanism 248 which is disposed above the bearing 241 to keep air-tight sealing. Thus, an inside space of the housing 22 and the inside space of the lift base 14 which communicates therewith via the cylindrical shaft 21 are given air-tight sealing against the outside.

The rotation shaft 420 of the link arm mechanism 42A (the right-hand side as in FIG. 3) has a lower end provided with a pulley 420a, and a belt 253 is routed around the pulley 420a and a pulley 613 of the first connecting member 61. Thus, as the motor M3 drives, rotating power from the motor M3 is transmitted by a mechanism of the first transmission shaft 26, the first engagement member 71, the first connecting member 61 and the belt 253, to the rotation shaft 420 to drive the link arm mechanism 42A. On the other hand, the rotation shaft 420 of the link arm mechanism 42B (the left-hand side as in FIG. 3) has a lower end provided with a pulley 420b, and a belt 254 is routed around the pulley 420b and a pulley 623 of the first connecting member 62. Thus, as the motor M4 drives, rotating power from the motor M4 is transmitted by a mechanism of the belt 252, the second transmission shaft 27, the second engagement member 72, the second connecting member 62 and the belt 254, to the rotation shaft 420 to drive the link arm mechanism 42B.

As the first link arm mechanism 42A is driven, the lower hand 5A slides horizontally on the two inner guide rails 41A. As the second link arm mechanism 42B is driven, the upper hand 5B slides horizontally on the two outer guide rails 41B without interfering with the hand 5A. During this movement, the extension 53a which connects the hand 5A with the link arm mechanism 42A slides without being interfered by the guide member 3. Thus, the works W which are placed on the fingers 52a, 52b of the hands 5A, 5B are carried in a stable movement.

The transfer apparatus A1 as has been described thus far is used in manufacturing processes of e.g. liquid crystal display panels, in order to move works in and out of process chambers. In this case, the transfer apparatus A1 is installed in a vacuum environment in a transport chamber, for example, which is surrounded by a plurality of process chambers.

According to the transfer apparatus A1, the swivel 2 which supports the linear movement mechanism 4 and rotates about the vertical axis Os, can be divided into an upper portion, i.e. the housing 22, and a lower portion, i.e. the cylindrical shaft 21, as described earlier, at the time of installation for example.

Figure 5:
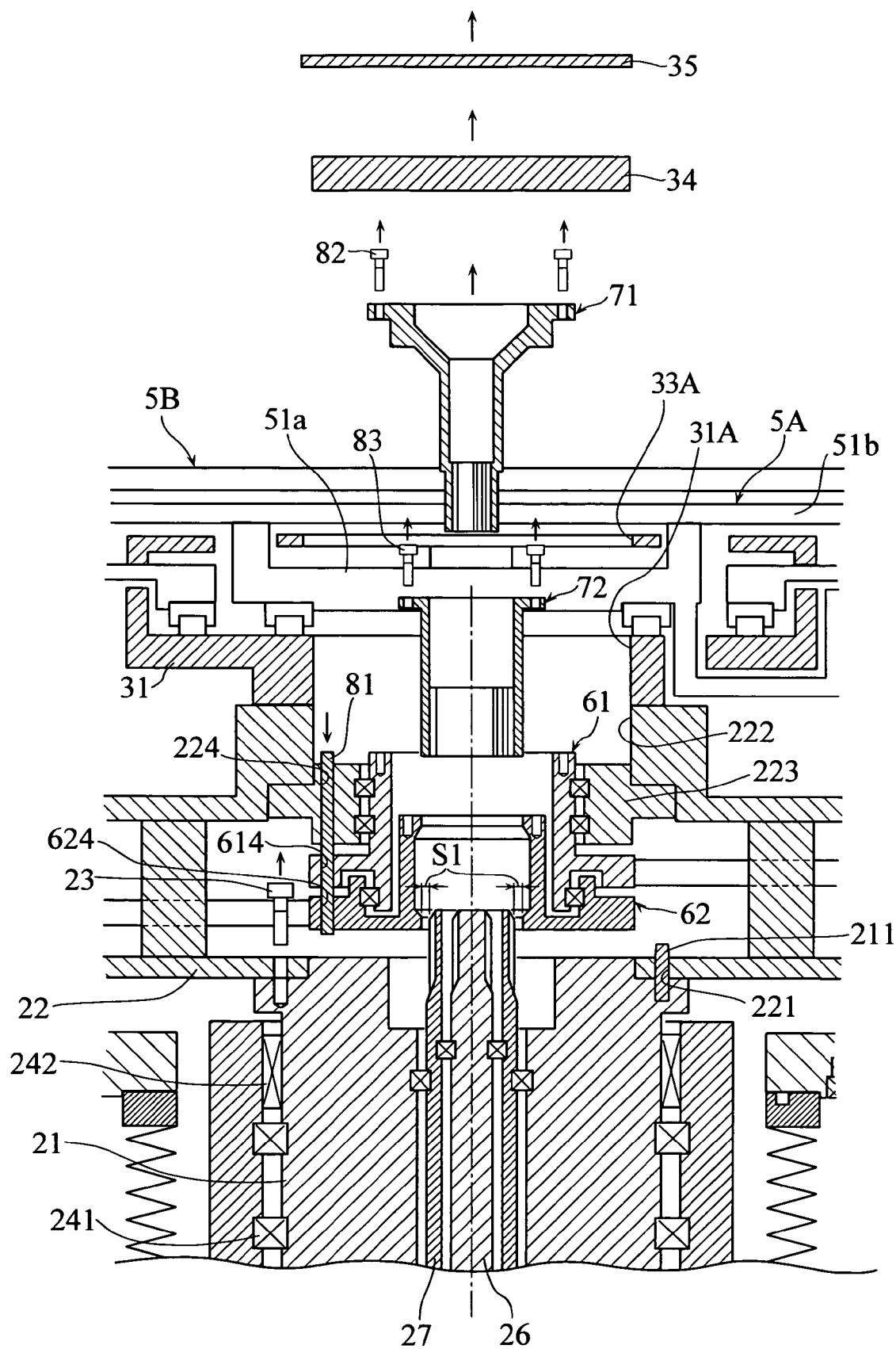
FIG. 5 illustrates a disassembling procedure.

The separation of the housing 22 from the cylindrical shaft 21 may be achieved by the following procedure to be described with reference to FIG. 5. First, the support arms 51a, 51b of the respective hands 5A, 5B are moved away from above the lid 35, and then the lid 35 and the lid 34 are removed.

Next, the motors M3, M4 are driven to rotate the first and the second connecting members 61, 62 with respect to the support member 223, whereby the through-hole 224 in the support member 223, and the through-holes 614, 624 in the first and the second connecting members 61, 62 are brought in alignment on a straight line. Under this state, the pin 81 is inserted through these through-holes 224, 614, 624. This prevents the connecting members 61, 62 from rotating with respect to the support member 223.

Next, the mounting bolts 82 are loosened to remove the first engagement member 71 from the first connecting member 61. The first engagement member 71 is then pulled upward through the opening 222 in the housing 22 and the openings 31A, 33A in the guide-member 3. This breaks the connection between the first transmission shaft 26 and the first connecting member 61. Next, the mounting bolts 83 are loosened to remove the second engagement member 72 from the second connecting member 62. The second engagement member 72 is then pulled upward through the opening 222 in the housing 22 and the openings 31A, 33A in the guide member 3. This breaks the connection between the second transmission shaft 27 and the second connecting member 72.

Next, the fastening bolts 23 are loosened to disconnect the cylindrical shaft 21 of the swivel 2 from the housing 22.

Subsequently, unillustrated hooks, for example, are placed on appropriate lift points on an upper portion of the guide member 3. By lifting these hooks, it is possible to separate the housing 22 of the swivel 2, the guide member 3, and the linear movement mechanism 4 supported by the housing 22 of the swivel 2, the guide member 3, and the housing 22 through guide member 3 all in a single assembly, from the stationary base 1.

Connection between the cylindrical shaft 21 (lower section) and the housing 22 (upper section) can be made by a reverse procedure of the disassembling procedure. Specifically, first, by placing the housing 22 on the cylindrical shaft 21 and then tightening the fastening bolts 23, connection is made between the housing 22 and the cylindrical shaft 21. Because the knock pins 211 guarantee highly accurate positioning of the housing 22 with respect to the cylindrical shaft 21, it is possible to reestablish substantially the same relative positioning as before disassembling. Subsequently, the second engagement member 72 is attached to the second connecting member 62, and thereafter, the first engagement member 71 is attached to the first connecting member 61. Subsequently, the pin 81 is removed to allow the first and the second connecting members 71, 72 relatively rotatable to the support member 223.

In recent years, there is a trend in manufacture of liquid crystal display panels to increase the panel size. As a result, the travel stroke GL has to be increased, and the linear movement mechanism 4 including the guide rails 41A, 41B has to be increased in size in the direction of the travel stroke GL. However, according to the transfer apparatus A1 offered by the present embodiment, it is possible to separate the linear movement mechanism 4 as supported by the housing 22 of the swivel 2 through guide member 3, and therefore it becomes easy to handle the transfer apparatus A1 at a time of installation for example.

Further, according to the transfer apparatus A1, removal of the first and the second engagement members 71, 72 will provide a gap space S1 between an outer structure or the second transmission shaft 27 of the first and the second transmission shafts 26, 27 and an inner structure or the second connecting member 62 of the first and the second connecting members 61, 62, circumferentially of the vertical axis Os by as much as the thickness of the cylindrical shaft 721 in the second engagement member 72. Hence, when separating or attaching the housing 22 (upper section) with respect to the cylindrical shaft 21 (lower section) of the swivel 2, undue contact between the second transmission shaft 27 and the second connecting member 62 is avoided even if the housing 22 is moved up or down, eliminating a problem of gauging or deforming of these members as a result of mutual contact.

Further, according to the transfer apparatus A1, the pin 81 is inserted into the through-holes 224, 614, 624 of the support member 223 in the first and the second connecting members 61, 62 as described earlier at the time when the housing 22 (upper section) is separated from the cylindrical shaft 21 (lower section) of the swivel 2. This arrangement makes it possible to temporarily fix each of the first and the second connecting members 61, 62 so as not to rotate with respect to the housing 22. Note that during this fixing operation the first and the second transmission shafts 26, 27 are held immovably by braking function of the motors M3, M4. Hence, when the first and the second engagement members 71, 72 are attached to the first and the second connecting members 61, 62, all positioning relationships between the first connecting member 61 and the first transmission shaft 26, as well as between the second connecting member 62 and the second transmission shaft 27 are kept intact. This eliminates need for adjustment such as re-positioning at the time when attaching the first and the second engagement members 71, 72, making the embodiment easy to handle.

FIG. 6 through FIG. 12 show a transfer apparatus A2 according to a second embodiment of the present invention. It should be noted here that in FIG. 6 and in the figures thereafter, elements which are identical with or similar to those in the first embodiment will be indicated by the same reference codes, and their description will be skipped as appropriately.

Figure 6:
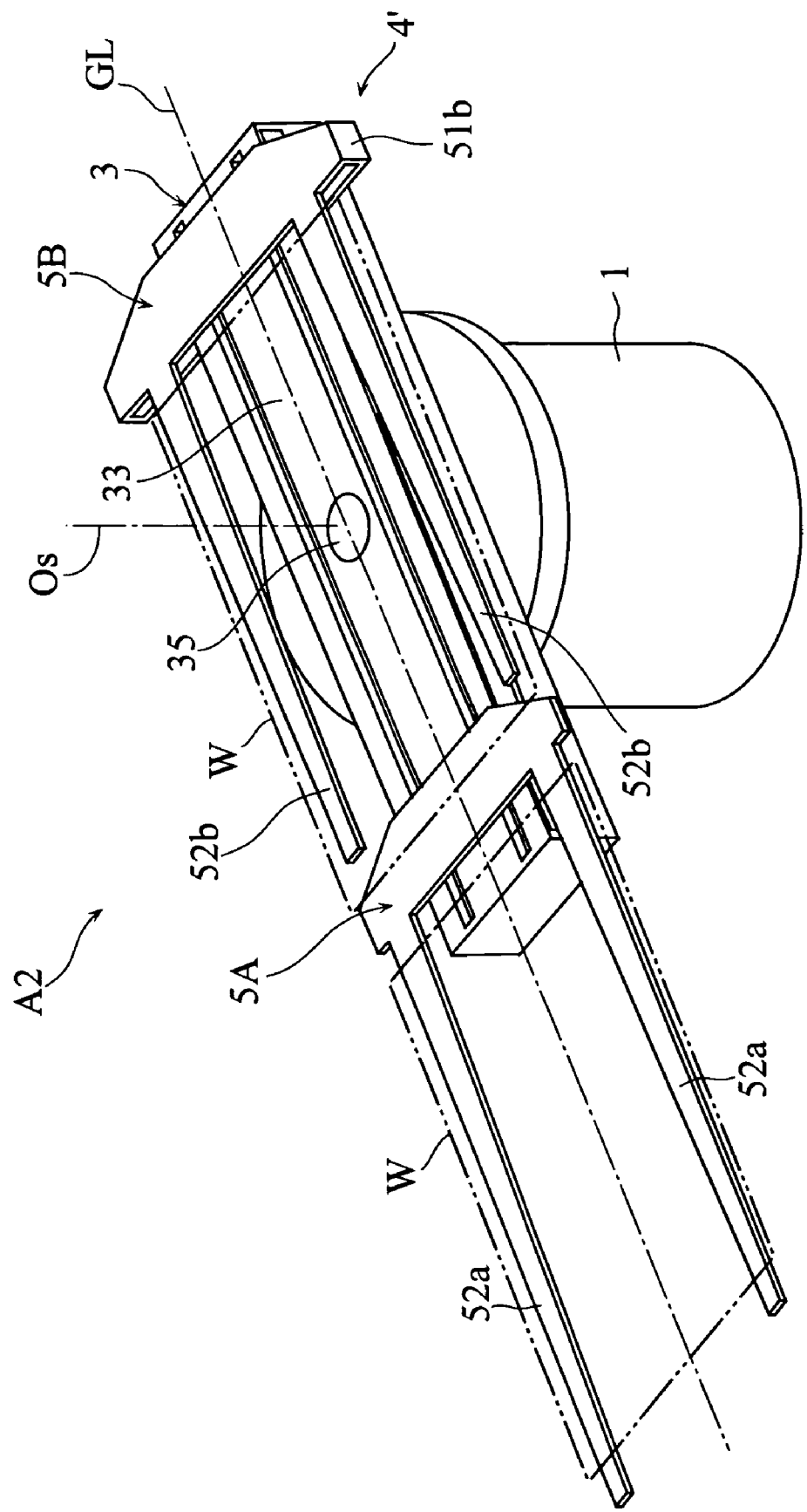
FIG. 6 is an overall perspective view of a transfer apparatus according to a second embodiment of the present invention.
Figure 7:
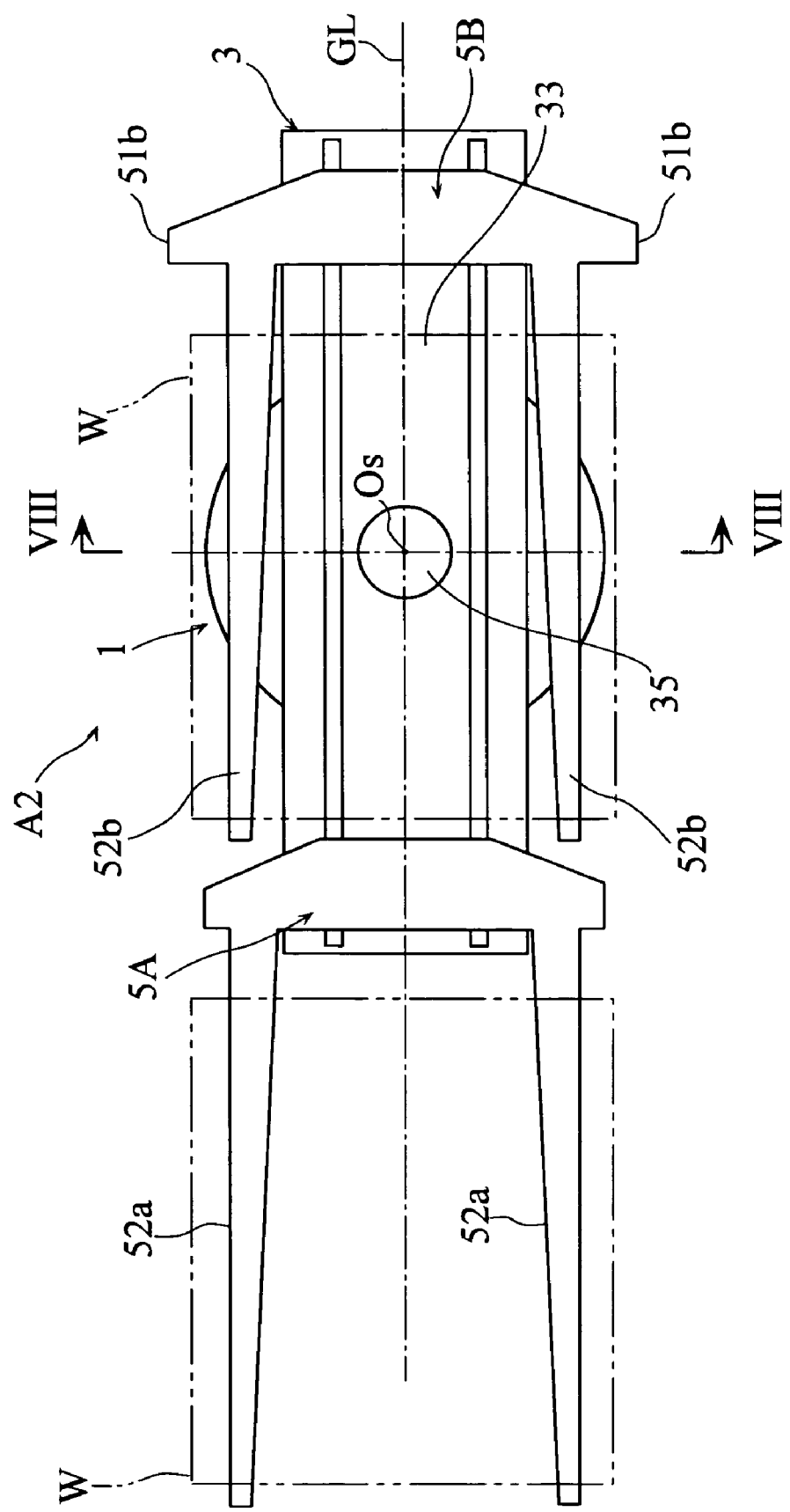
FIG. 7 is a plan view of the transfer apparatus in FIG. 6.
Figure 8:
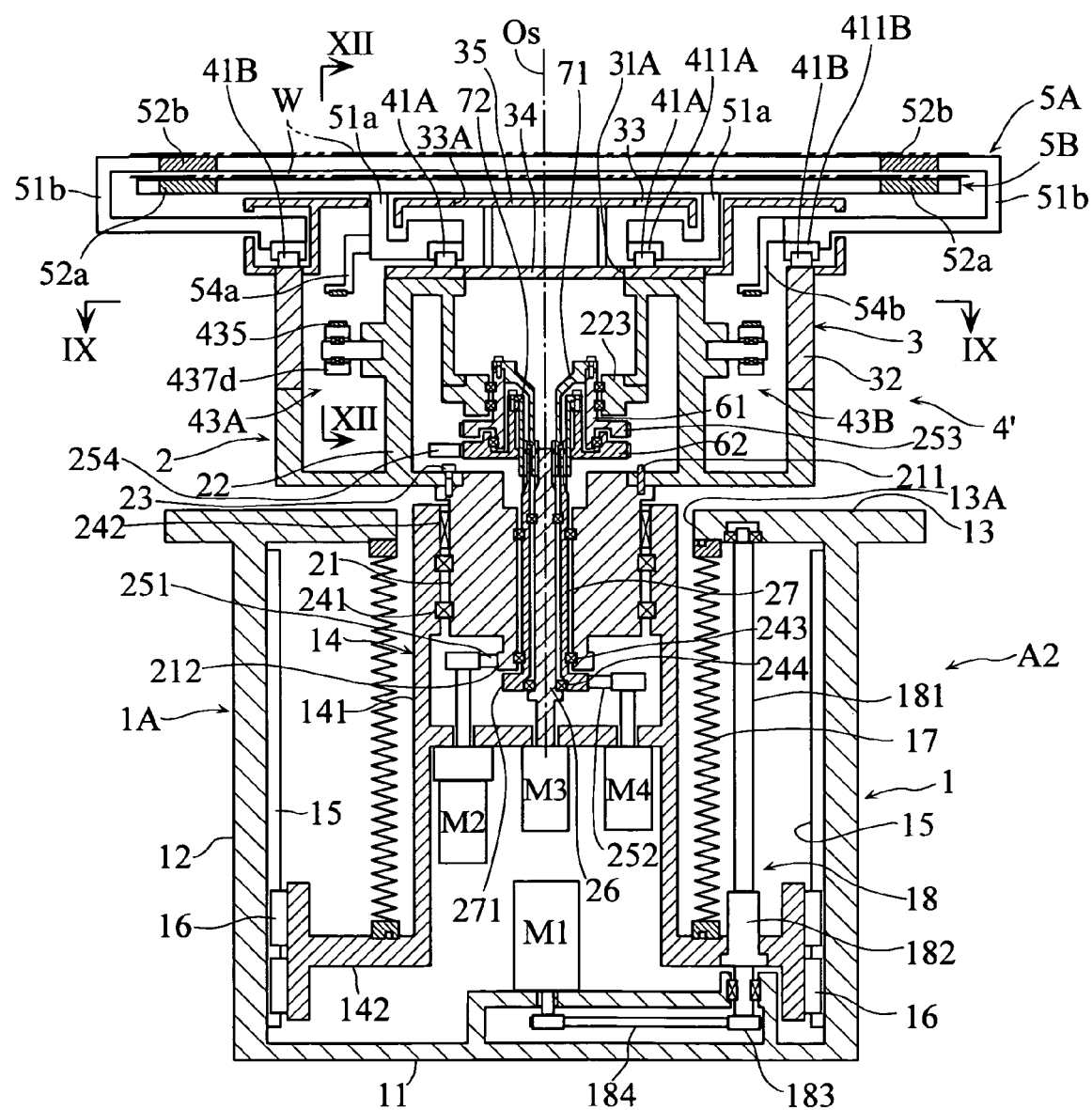
FIG. 8 is a sectional view taken along lines VIII-VIII in FIG. 7.

As shown in FIG. 6 through FIG. 8, the transfer apparatus A2 according to the present embodiment includes a stationary base 1, a swivel 2, a guide member 3, a linear movement mechanism 4' and a pair of hands 5A, 5B, and like the transfer apparatus A1 according to the first embodiment, the device serves in carrying thin plate-like works W along a straight travel stroke GL. It should be noted here that FIG. 8 and the figures thereafter differ from FIG. 6 and FIG. 7 in that both of the hands 5A, 5B are above the stationary base 1.

The linear movement mechanism 4' according to the present embodiment includes a pair of horizontal drive mechanisms 43A, 43B. The horizontal drive mechanisms 43A, 43B are belt driven. In other words, the transfer apparatus A2 according to the present embodiment differs mainly from the transfer apparatus A1 according to the first embodiment, in that the link arm mechanisms 42A, 42B are replaced by the horizontal drive mechanisms 43A, 43B, and in association with this change, a number of design changes are implemented. It should be noted here that the transfer apparatus A2 include a first and a second connecting members 61, 62, and a first and a second engagement members 71, 72. These members are arranged the same way as in the first embodiment.

The first and the second horizontal drive mechanisms 43A, 43B are essentially identical with each other. The following description will cover the first horizontal drive mechanism 43A in detail, and description of the second horizontal drive mechanism 43B will be skipped as appropriately.

Figure 9:
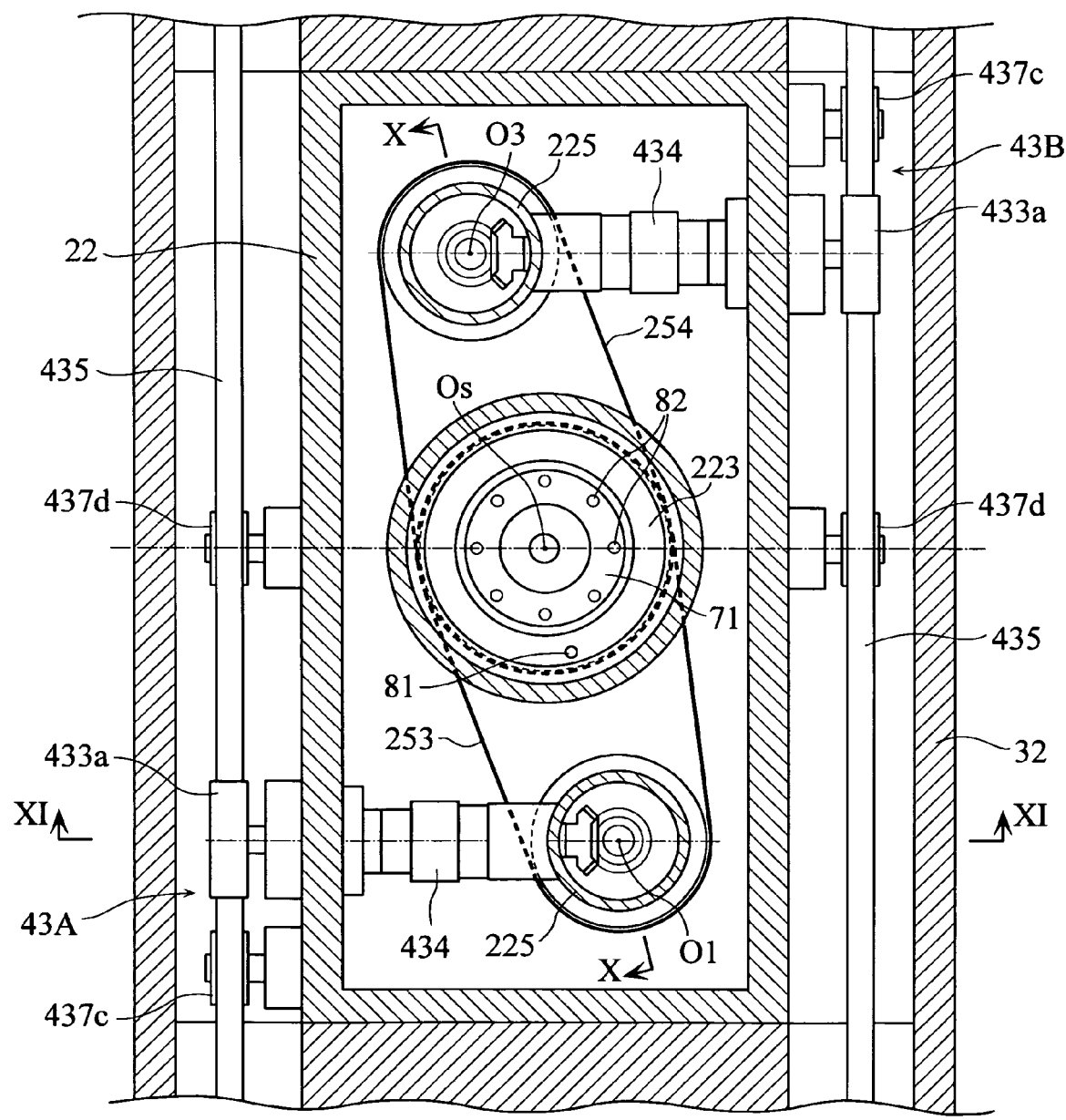
FIG. 9 is a sectional view taken along lines IX-IX in FIG. 8.
Figure 10:
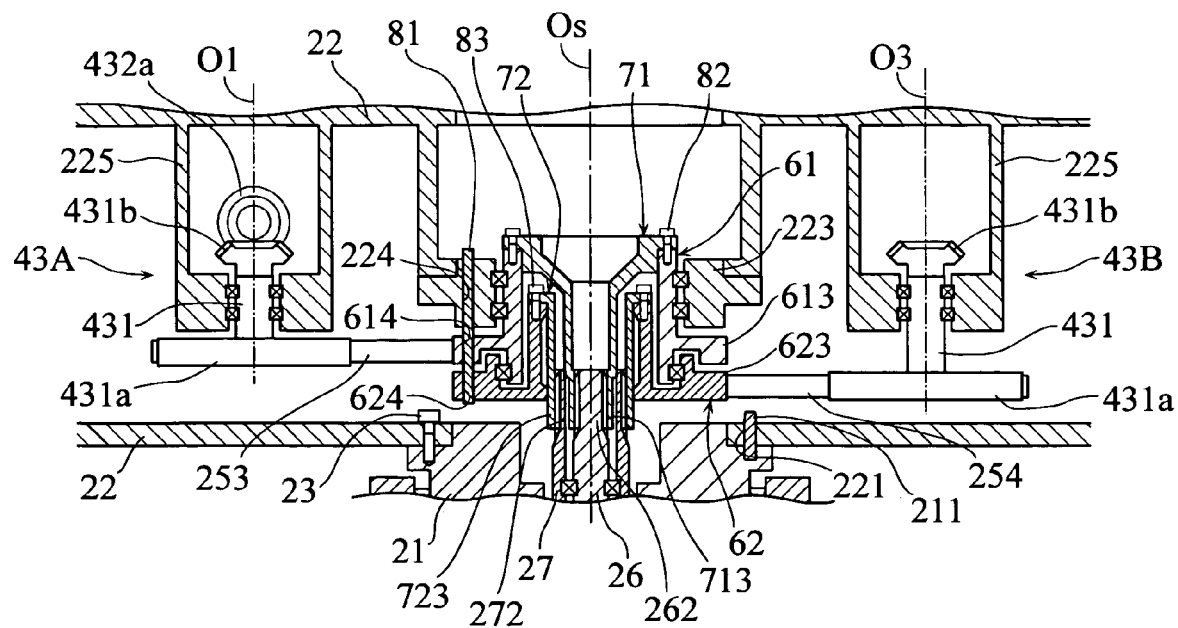
FIG. 10 is a sectional view taken along lines X-X in FIG. 9.
Figure 11:
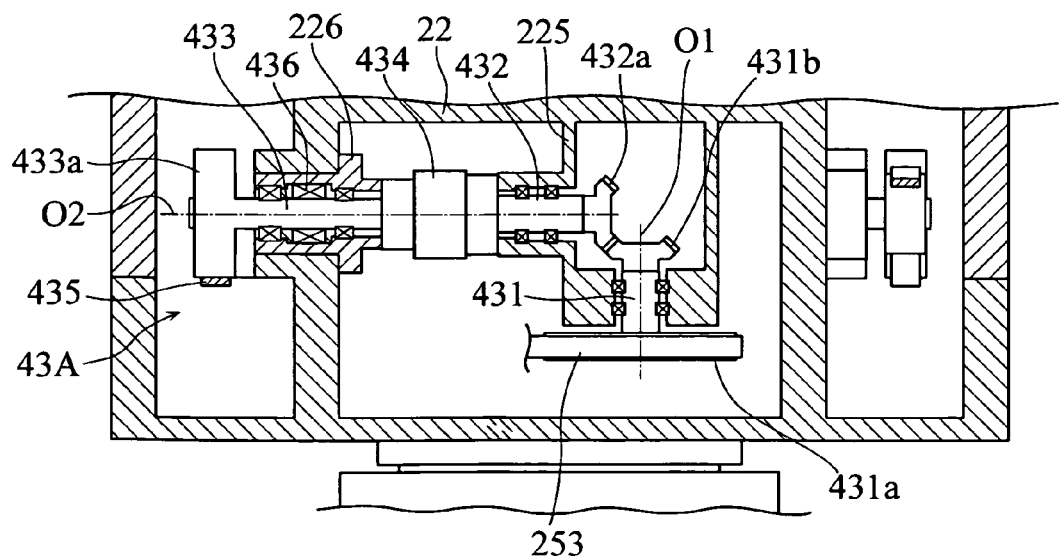
FIG. 11 is a sectional view taken along lines XI-XI in FIG. 9.

As shown in FIG. 9 through FIG. 11, the horizontal drive mechanisms 43A includes transmission shafts 431, 432, 433, a speed reduction mechanism 434 and an output belt 435. The transmission shaft 431 is supported rotatably about a vertical axis O1 by a cylindrical support 225 which comes down from an upper portion of the housing 22 of the swivel 2. The transmission shaft 431 has a lower end provided with a pulley 431a. A belt 253 is routed around this pulley 431a and a pulley 613 of the first connecting member 61. On the other hand, the transmission shaft 431 has an upper end provided with a bevel gear 431b.

As shown clearly in FIG. 11, the transmission shaft 432 is supported rotatably about a horizontal axis O2 by a support 225. The transmission shaft 432 has an end provided with a bevel gear 432a. The bevel gear 432a is engaged with a bevel gear 431b provided on an upper end the transmission shaft 431. The transmission shaft 432 has another end connected with an inputting end of the speed reduction mechanism 434.

The transmission shaft 433 is supported rotatably about the horizontal axis O2 by a support member 226 which is attached to the housing 22. An unillustrated seal member provides air-tight sealing between the support member 226 and the housing 22. The transmission shaft 433 has an end connected with an outputting end of the speed reduction mechanism 434. The transmission shaft 433 has another end provided with a drive pulley 433a. A sealing mechanism 436 is provided between the transmission shaft 433 and the support member 226. The sealing mechanism 436 provides air-tight sealing for the inside of the housing 22 and inside of the lift base 14 communicating therewith via the cylindrical shaft 21 against the outside.

Figure 12:
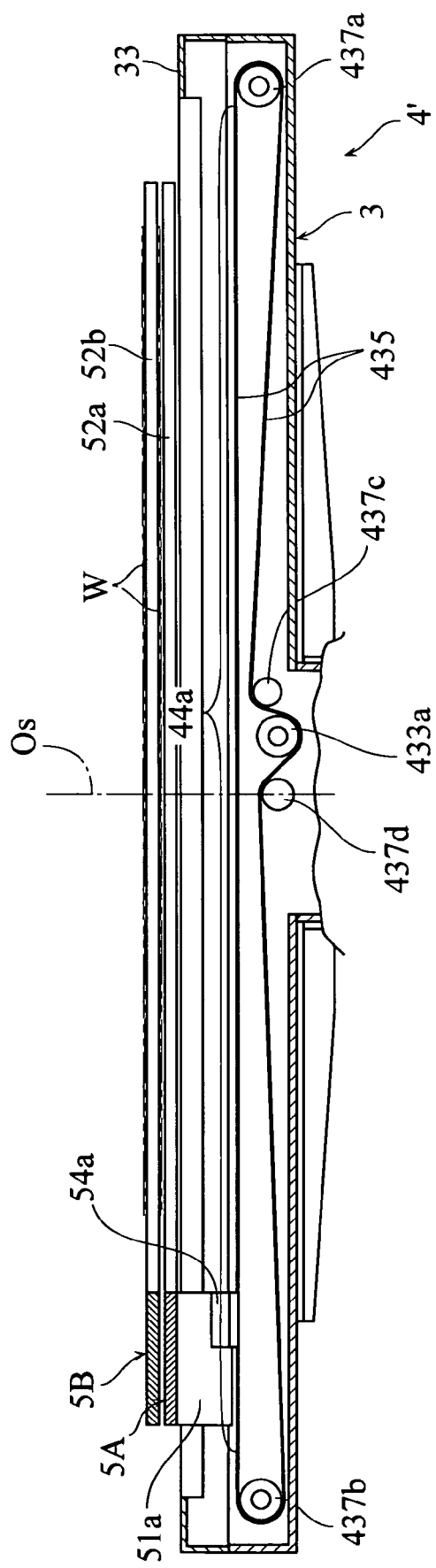
FIG. 12 is a sectional view taken along lines XII-XII in FIG. 8.

As shown in FIG. 9 or FIG. 12, the output belt 435 is routed around the drive pulley 433a, and pulleys 437a through 437d. The pulleys 437a, 437b are provided near longitudinal ends of the guide member 3 (along the travel stroke GL). On the other hand, pulleys 437c, 437d are provided near the drive pulley 433, and outside of the output belt 435. Thus, the output belt 435 is given an appropriate tension. The output belt 435 may be provided by a timing belt.

With the above-described arrangement, as the motor M3 drives, rotating power from the driving motor M3 is transmitted by a mechanism of the first transmission shaft 26, the first engagement member 71, the first connecting member 61 and the belt 253, to the first horizontal drive mechanism 43A, which then drives the drive pulley 433a and hence the output belt 435 to make a reciprocating movement.

The pulleys 437a, 437b are disposed along a line which is parallel to the travel stroke GL. In this layout, a region along the output belt 435 and above the pulleys 437a, 437b is defined as a section 44a which is parallel to the travel stroke GL, and the output belt 435 can make reciprocating movement in this section 44a.

The hands 5A, 5B according to the present embodiment have basically the same configuration as the hands 5A, 5B in the first embodiment, differing however, in that they have connecting members 54a, 54b extending from the support arms 51a, 51b as shown in FIG. 8, instead of the extension 53a and the shaft 53b. The connecting member 54a is connected with the output belt 435 at a predetermined position within the section 44a. Thus, as the first horizontal drive mechanism 43A is driven, the hand 5A slides horizontally along the travel stroke GL, on the inner guide rails 41A.

In the second horizontal drive mechanism 43B, the transmission shaft 431 is supported rotatably about the vertical axis O3 as shown in FIG. 10. The vertical axis O3 opposes the vertical axis O1, with the vertical axis Os in between. The transmission shaft 431 (the one on the right side as in the figure) has a lower end provided with a pulley 431a, and a belt 254 is routed around the pulley 431a and the pulley 623 of the second connecting member 62. As the motor M4 is driven, rotating drive power of the drive motor M4 is transmitted by the mechanism of the belt 252, the second transmission shaft 27, the second engagement member 72, the second connecting member 62, and the belt 254, to the second horizontal drive mechanism 43B, which then drives the drive pulley 433a and hence the output belt 435 to make a reciprocating movement. Further, a connecting member 54b which extends from a support arm 51b of the hand 5B is connected with a predetermined place of the output belt 435. Thus, as the second horizontal drive mechanism 43B is driven, the hand 5B slides horizontally along the travel stroke GL, on the two outer guide rails 41B.

According to the transfer apparatus A2 which is arranged as described above, the swivel 2 is separable into an upper section, i.e. the housing 22, and a lower section, i.e. the cylindrical shaft 21, just as described earlier in relation to the first embodiment. Separation and connection between the housing 22 and the cylindrical shaft 21 can be achieved in the same way as described for the transfer apparatus A1 in the first embodiment. As will be understood, the transfer apparatus A2 according to the present embodiment also provides the same advantages as described earlier in relation to the transfer apparatus A1.

Embodiment of the present invention being thus far described, it should be understood that the scope of the present invention is not limited to the embodiments recited above. Specific details of the transfer apparatus according to the present invention may be varied in many different ways within the spirit of the present invention.

For example, the hand on which a work is placed may not necessarily be two like the hands 5A, 5B as in the embodiments, but the device may use a so-called single-hand configuration for example, equipped with only one hand.

Further, the output belt 435 used in the second embodiment for the first and the second horizontal drive mechanisms 43A, 43B may not necessarily be provided by a timing belt, but may be provided by a flat belt, steel belt or a wire, for example.

The embodiment was described under an assumption that the device will be used in a vacuum condition. Obviously, however, the transfer apparatus according to the present invention may be made for use under an atmospheric condition.

The invention claimed is:

1. A transfer apparatus comprising:
a stationary base;
a swivel supported by the stationary base and rotatable about a vertical axis, the swivel including a cylindrical shaft and a housing provided above and detachably connected with the cylindrical shaft;
a guide member mounted on the swivel;
a linear movement mechanism supported by one of the swivel and the guide member;
a hand supported by the linear movement mechanism and moved by the linear movement mechanism for carrying a work along a straight and horizontal travel stroke;
a drive source disposed inside the stationary base;
a transmission shaft disposed along the vertical axis for transmission of drive power from the drive source to the linear movement mechanism;
a connecting member connected to the linear movement mechanism and accommodated by the housing and being rotatable about the vertical axis; and
an engagement member brought into engagement with the transmission shaft from above and detachably connected with the connecting member; wherein:
the hand includes a first hand and a second hand movable along the travel stroke without interfering with each other;
the linear movement mechanism includes a first drive mechanism and a second drive mechanism for driving the first and the second hands respectively;
the connecting member is constituted by a first connecting member and a second connecting member disposed concentrically to each other in correspondence to the first and the second drive mechanisms;
the transmission shaft is constituted by a first transmission shaft and a second transmission shall disposed concentrically to each other in correspondence to the first and the second drive mechanism; and
the engagement member includes a first engagement member engageable with the first transmission shaft and detachable from the first connecting member, and a second engagement member engageable with the second transmission shaft and detachable from the second connecting member.

2. The transfer apparatus according to claim 1, wherein the first and the second transmission shafts are spaced from the first and the second connecting members by a predetermined gap circumferentially of the vertical axis.

3. The transfer apparatus according to claim 1, wherein each of the first and the second transmission shafts has an upper end formed as a spline shaft portion, each of the first and the second engagement members having a spline boss portion for engagement with a corresponding one of the spline shaft portions.

4. The transfer apparatus according to claim 1, wherein each of the first and the second connecting members has a partial overlap with the housing within a rotation plane, the housing and each of the first and the second connecting members having a through-hole for insertion of a pin.

* * * * *